United States Patent [19]

Park

[11] Patent Number: 5,432,512

[45] Date of Patent: Jul. 11, 1995

[54] APPARATUS FOR DECODING VARIABLE LENGTH CODES

[75] Inventor: Yong-Gyu Park, Seoul, Rep. of Korea

[73] Assignee: Daewoo Electronics Co., Ltd., Seoul, Rep. of Korea

[21] Appl. No.: 176,084

[22] Filed: Dec. 30, 1993

[30] Foreign Application Priority Data

Dec. 31, 1992 [KR] Rep. of Korea ............ 92-27252

[51] Int. Cl.$^6$ .............................................. H03M 7/40
[52] U.S. Cl. ............................................................ 341/67
[58] Field of Search ............... 341/67, 59, 65, 79, 341/95, 106, 107

[56] References Cited

U.S. PATENT DOCUMENTS

| | | | |
|---|---|---|---|
| 4,853,696 | 8/1989 | Mukherjee | 341/65 |
| 4,899,149 | 2/1990 | Kahan | 341/67 |
| 5,173,695 | 12/1992 | Sun et al. | 341/67 |
| 5,309,156 | 5/1994 | Fujiyama | 341/67 |
| 5,343,195 | 8/1994 | Cooper | 341/67 |

*Primary Examiner*—Brian Young
*Attorney, Agent, or Firm*—William F. Pinsak

[57] ABSTRACT

A variable length code decoding apparatus comprises an interface circuit for extracting in parallel an objective bit stream having a predetermined number of bits from a $2^n$-bit variable length coded serial input bit stream (n is a positive integer), a control circuit for generating a buffer control signal, a barrel shifter control signal, a carry signal and a clock signal, and a lookup table memory connected to the interface circuit and the control circuit, for decoding the objective bit stream from the interface circuit and outputting a decoded symbol and a codeword length corresponding to the decoded symbol.

2 Claims, 2 Drawing Sheets

APPARATUS FOR DECODING VARIABLE LENGTH CODES

FIELD OF THE INVENTION

The present invention relates to a variable length code (VLC) decoding apparatus; and, more particularly, to an improved VLC decoding apparatus which is capable of providing a high speed decoding operation by reducing the time delays occurring in the decoder components during the decoding operation.

DESCRIPTION OF THE PRIOR ART

Variable length coding is a technique often used for effective data compression. This technique is used to convert fixed-length data to variable-length codewords based on the statistics of the data. The length of the codewords is chosen in such a manner that shorter codewords are used to represent more frequently occurring data and longer codewords are chosen to represent less frequently occurring data. By properly assigning the variable-length codewords to a library of all possible source codewords, the average word length of the variable-length codewords becomes shorter than that of the original data, thereby rendering it possible to achieve an effective data compression.

In this connection, the Huffman code design is a procedure commonly used to construct a minimum redundant variable length code for a known data statistic. In general, the encoding process can be implemented by using a lookup table. The codewords and the word length information are stored as the contents of the table and outputted sequentially through the use of a buffer at a constant data rate onto the data channel.

In digital video systems, the data rate is usually very high. Therefore, a primary requirement for a variable length encoder or decoder used in such a system is that such encoding or decoding be carried out in a high speed. To achieve the high speed coding or decoding, it may be desirable to use the technique of parallel processing. Because the inputs to a variable length encoder are of fixed length data words, it is rather easy to partition them for parallel encoding.

However, the decoding process is more complicated. Due to the fact that it has a variable length, each codeword has to be segmented from the received bit stream before it can be decoded into a source symbol, which makes it difficult to use the parallel processing. Because of this constraint, the input data is normally decoded on a bit-by-bit basis, using what is known as a bit serial decoder.

One of the bit serial decoding apparatus commonly employed to decode a stream of variable length codewords is a VLC decoder employing a tree-searching algorithm such as the one disclosed in U.S. Pat. No. 4,899,149 issued on Feb. 6, 1990 to Gary Kahan. In this device, a variable length code is represented by a tree with codewords as leaves(which are also called terminal nodes). The decoding process starts from the root of the code tree and is guided by the received bit stream to follow one of two branches at each node. When a leaf is reached, the end of a codeword is detected and is segmented from the remaining bit stream. This type of decoding apparatus includes a logic circuitry corresponding to the tree and a control circuitry to traverse the code tree. This approach may be slow, however, especially for long codewords, since the bit-by-bit search through the code tree is required for each decoded symbol.

Another exemplary type of the bit serial decoder is disclosed in U.S. Pat. No. 4,853,696 issued on Aug. 1, 1989 to A. Mukherjee; and which is also described in A. Mukherjee et al., "Efficient VLSI Designs for Data Transformation of Tree-Based Codes", IEEE Transactions on Circuits and Systems, 38, No. 3, pp. 306–314 (March, 1991). This bit serial decoder is also implemented through the use of Huffman tree. However, this bit serial decoder fails to meet the high data rate requirement of a video system because its decoding speed is rather low, i.e., only one bit cycle.

Accordingly, it has been felt that some kind of parallel processing is necessary to effectively implement a variable length decoder. One of the proposed techniques is to partition the data to be encoded into segments and insert a unique word between each adjacent segment. A unique word means a word that cannot be generated by a combination of the codewords. At the decoder, the unique word is utilized to detect the boundary between the adjacent segments. Under the scheme, several variable length decoders are employed to decode the like number of segments simultaneously.

Although a high parallelism may be achieved via this architecture, there are several disadvantages. First, a great deal of extra hardware is required. Secondly, a decoder of this type can only be used with an encoder which employs the unique word system. In addition, the insertion of the unique word will further compromise the compression efficiency.

As indicated above, one of the difficulties associated with a variable length decoder is that the length of an incoming codeword is not known in advance: or once the length of an incoming codeword is known, the decoder can begin to decode it with relative ease.

With the above in mind, a parallel structure for a variable length decoder has been developed by Ming-Ting Sun et al., "An Entropy Coding System for Digital HDTV Applications", *IEEE Transactions on Circuits and Systems for Video Technology*, 1, No. 1 (March, 1991).

The VLC decoder disclosed in this article, as shown in FIG. 1, includes an interface circuit 100 having a buffer 10, a first and a second latches 11 and 12, and a barrel shifter 13, a lookup table memory 200 having a codeword table 21, a codeword length table 22 and a decoded word table 23, and a control circuit 300 having an accumulator 31, a third and a fourth latches 32 and 33, an AND gate 34 and a clock.

As may be seen from FIG. 1, responding to various control signals, the interface circuit 100 extracts in parallel an objective bit stream having a predetermined number of bits from a $2^n$-bit variable length coded serial input bit stream (wherein n is a positive integer). The lookup table memory 200 decodes the objective bit stream from the interface circuit 100 to output a decoded symbol and a codeword length corresponding to the decoded symbol. In the control circuit 300, the codeword length from the lookup table memory 200 is accumulated and a carry signal is generated whenever the decoding of the objective bit stream in the lookup table memory 200 is completed; and, thereafter, the accumulated codeword length and the carry signal are received and held in the third and the fourth latches 32 and 33, respectively. The accumulated codeword length in the third latch 32 is provided as a barrel shifter control signal to the barrel shifter 40. At this time, the carry signal in the fourth latch 33 is provided to the AND gate 34. The AND gate 34 receives and combines the carry signal and a clock signal from the clock to synchronize the carry signal to the clock signal. The synchronized carry signal is then coupled as a read signal to the buffer 10 and the first and the second latches 11, 12.

Unfortunately, however, this VLC decoder suffers from various component-related operation delays. That is, responding to the read signal coupled via the AND gate 34, the buffer 10 and the first and the second latches 12 and 13 reach an enable status, simultaneously. At this juncture, since the latch 12 receives the current bit stream from the buffer 10, the time interval for bit stream transmission from the buffer 10 to the latch 12 results in a latch operation delay.

And, as shown in FIG. 1, the carry signal and the accumulated codeword length are outputted simultaneously from the third and the fourth latches 32 and 33, respectively. However, the barrel shifter control signal is directly connected to the barrel shifter 40 while the carry signal is indirectly sent via the AND gate 34 to the first and the second latches 12 and 13. Since the barrel shifter 40 receives the current bit stream from the two latches 12,13, the operation delay caused by the indirect connection of the carry signal produces an operation delay at the barrel shifter.

Consequently, these delays may impede or deteriorate the operation speed of the VLC decoder which employs numerous components for sequentially processing incoming bit streams.

SUMMARY OF THE INVENTION

It is, therefore, a primary object of the present invention to provide a VLC decoding wherein the aforementioned component-related operation delays are eliminated to thereby advantageously achieve a high speed decoding operation.

In accordance with the present invention, there is presented an improved VLC decoding apparatus having an interface means for extracting in parallel an objective bit stream having a predetermined number of bits from a $2^n$-bit variable length coded serial input bit stream(n being a positive integer), a control means for generating a buffer control signal, a barrel shifter control signal, a carry signal and a clock signal, and a lookup table memory means connected to the interface means and the control means, for decoding the objective bit stream from the interface means and outputting a decoded symbol and a codeword length corresponding to the decoded symbol, wherein said interface means comprises:

a buffer for storing said input bit stream temporarily and, in response to the buffer control signal, extracting in parallel the objective bit stream having the predetermined number of bits;

a first latch means for, in response to the carry signal, receiving in parallel and holding the bit stream provided from the buffer and, in response to the clock signal, extracting in parallel the bit stream;

a second latch means for, in response to the carry signal, receiving in parallel and holding the bit stream from the first latch means and, in response to the clock signal, extracting in parallel the bit stream;

a barrel shifter for, in response to the barrel shifter control signal, receiving in parallel and holding the output bit stream from the first and the second latch means and then applying in parallel to the lookup table memory means the combined objective bit stream.

BRIEF DESCRIPTION OF THE DRAWINGS

The above and other objectives and features of the instant invention will become apparent from the following description of preferred embodiments taken in conjunction with the accompanying drawings, in which.

DETAILED DESCRIPTION OF THE PREFERRED EMBODIMENTS

Figure 2:
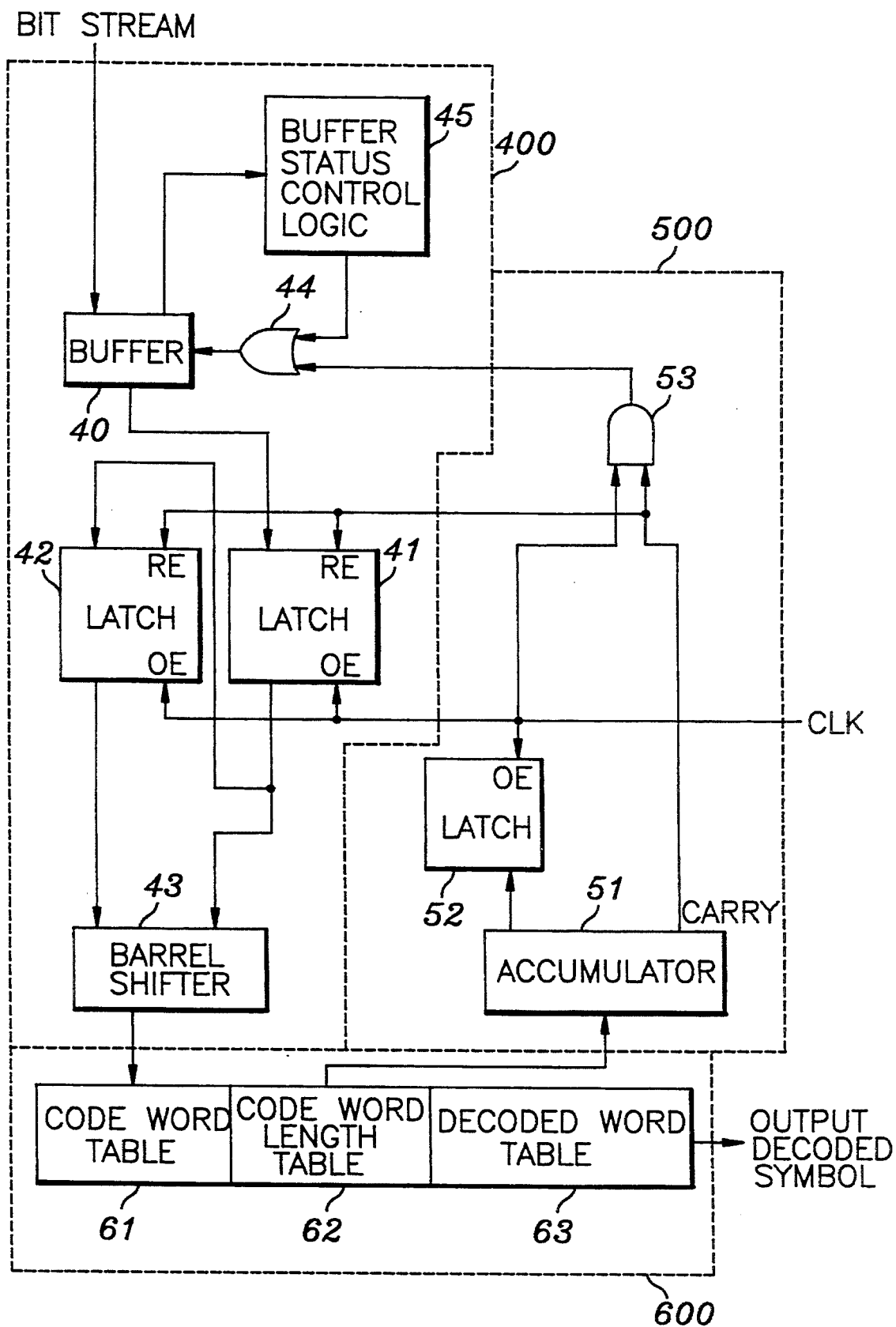
FIG. 2 is a block diagram of a VLC decoding apparatus in accordance with the present invention.

A VLC decoder in accordance with the present invention is shown in FIG. 2. The VLC decoder comprises an interface circuit 400, a control circuit 500, and a lookup table memory 600.

The interface circuit 400 is adapted to receive and hold a $2^n$-bit variable length coded serial input bit stream (wherein n is a positive integer) and to extract in parallel an objective bit stream having a predetermined number of bits from the input bit stream. For the purpose of preferred embodiment, 16-bit data as the objective bit stream is chosen, although data of other lengths may also be applicable. As shown in FIG. 2, the interface circuit 400 includes a buffer 40, a first and a second latches 41 and 42, a barrel shifter 43, an OR gate 44 and a buffer status control logic circuit 45. The control circuit 500 includes an accumulator 51, a third latch 52, an AND gate 53 and a clock. And the lookup table memory 600 includes a codeword table 61, a codeword length table 62 and a decoded word table 63.

In the interface circuit 400, the buffer 40 serves to store temporarily the input bit stream. The buffer status control logic circuit 45 detects initially the number of the bits stored in the buffer 40 to output only once a logic signal "1" if the number of the bits stored in the buffer 40 is more than a predetermined number. This logic signal "1" from the buffer status control logic circuit 45 is sent to the buffer 40 via the OR gate 44. And then the buffer 40 extracts a bit stream having a predetermined number of bits(e.g., 16 bits). At this time, since the latch 41 is not in a read enable status, the bit stream from the buffer 40 is in a data bus between the buffer 40 and the latch 41.

A carry signal from the accumulator 51 is provided to the first and the second latches 41,42 as a read enable signal and to the AND gate 53. The AND gate 53 receives and combines the carry signal and a clock signal to synchronize the carry signal to the clock signal. The synchronized carry signal is provided as a buffer control signal to the OR gate 44. The OR gate 44 couples the logic signal from the buffer status control logic circuit 45 and the buffer control signal to the buffer 40. In response to the read enable signal, the latch 41 receives in parallel and holds the bit stream which has been in the data bus. In response to the buffer control signal sent via the OR gate 44, the buffer 40 extracts the bit stream. This bit stream is in the data bus between the buffer 40 and the latch 41. This is a continuous process; and, therefore, a next bit stream for the latch 41 is always in the data bus between the buffer 40 and the latch 41.

Thereafter, the first latch 41 provides in parallel the bit stream to the second latch 42 and the barrel shifter 43 when the clock signal from the clock, i.e., output enable signal, is provided. In response to the read enable signal of the carry signal from the accumulator 51, the second latch 12 receives in parallel and holds the bit stream previously held in the first latch 41. Like the first latch 41, in response to the output enable signal, the second latch 42 provides in parallel the bit stream to the barrel shifter 43. Accordingly, when the output enable signal is provided, two bit streams from the first and the second latches 41 and 42 become available for the decoding process.

Figure 1:
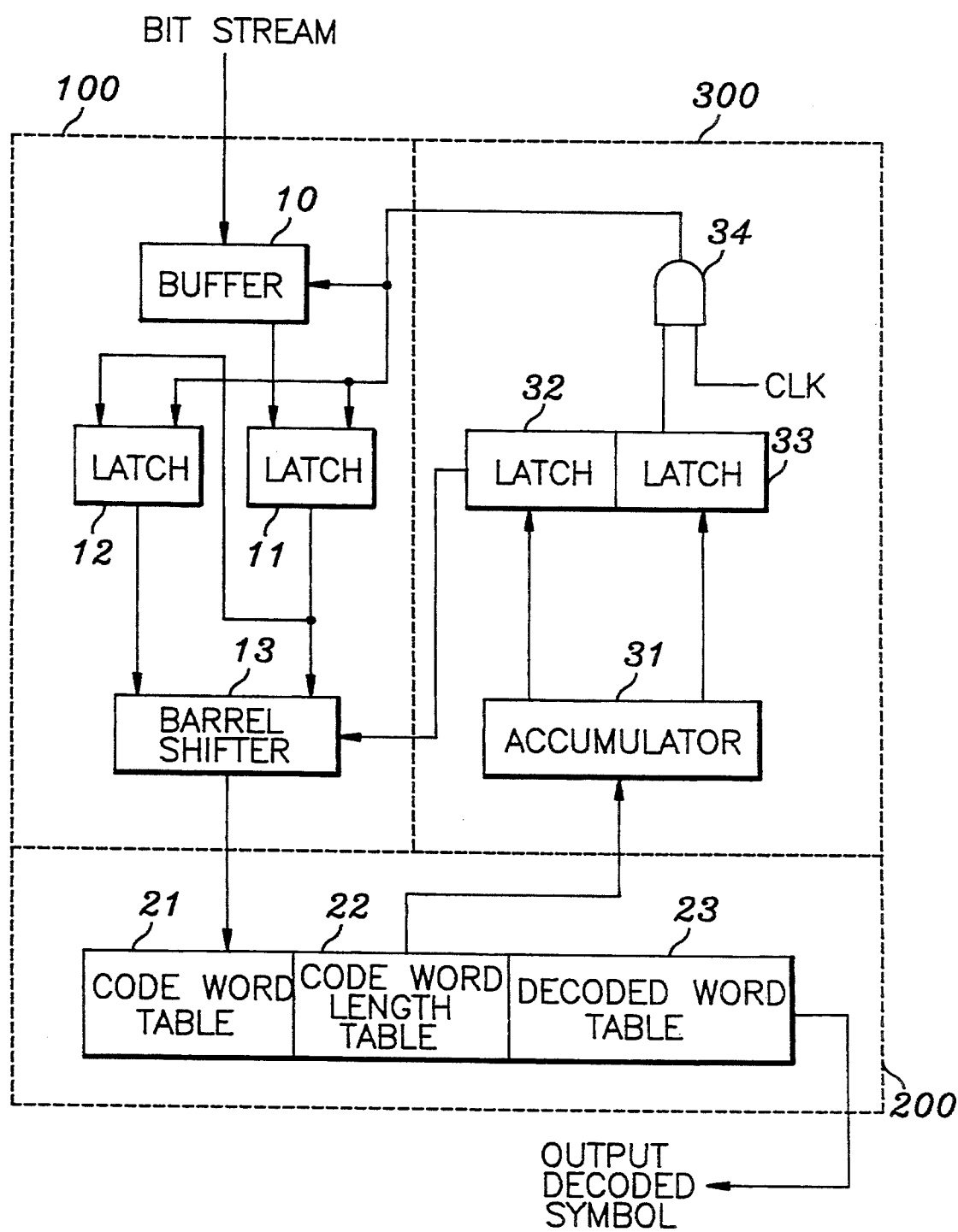
FIG. 1 is a block diagram of a conventional VLC decoding apparatus.

As shown in FIG. 2, the control signal for the two latches 41,42 and the barrel shifter 43 are directly connected, in contrast with the conventional VLC decoder depicted in FIG. 1. That is, the carry signal, without passing through the AND gate 53, is directly connected to the latches 41 and 42. Accordingly, the barrel shifter operation delay caused by the two latches 41,42 in the conventional device no longer occurs.

It should be noted that The length of the window of the barrel shifter 43 is equal to the bit number of the bit stream. This window has a variable location. The objective bit stream outputted by the barrel shifter 43 is provided to the lookup table memory 600.

The lookup table memory 600, as disclosed in the aforementioned article by Ming-Ting Sun et al., may be advantageously implemented in Programmable Logic Arrays (PLAs). The PLA-based lookup table memory 600 has an AND-plane 61, a length OR-plane 62 and a decoder OR-plane 63. The AND-plane 61 serves to detect the presence of a particular input codeword in the input bit. The OR-plane 62 stores a table which contains the length of each of the codewords. The decoder OR-plane 63 stores a table which contains the data symbol corresponding to each codeword.

These tables are addressed by matching an entry in the "AND" plane .with an input bit stream. Conceptually, each codeword can be represented as an entry in the "AND" plane according to the bit pattern of the codeword. When the input bit stream matches an entry in the "AND" plane, the entry in the "OR" plane corresponding to the word length of the decoded codeword and the entry in the "OR" plane corresponding to the decoded symbol become activated.

To illustrate the operation of the decoder, a sample VLC with six entries is shown in Table 1.

TABLE 1

| codeword | word length | symbol |
| --- | --- | --- |
| 00 | 2 | a |
| 01 | 2 | b |
| 100 | 3 | c |
| 101 | 3 | d |
| 110 | 3 | e |
| 1110 | 4 | f |
| 11110 | 5 | g |
| 11111 | 5 | h |

As may be seen from Table 1, the length of the codewords is chosen such that shorter codewords be used to represent more frequently occurring symbols and longer codewords be used to represent less frequently occurring symbols on the basis of the statistics of the symbol.

The codeword length information fed to the accumulator 51 is accumulated. The third latch 52 receives and holds the accumulated codeword lengths from the accumulator 51; and, in response to the clock signal, provides the barrel shifter control signal indicative of the accumulated codeword length to the barrel shifter 43.

The window of the barrel shifter 43 is then shifted to a position equal to the accumulated codeword length. Therefore, the next codeword to be decoded always starts from the leading bit of the barrel shifter output.

When the accumulated codeword length exceeds the objective bit number, the accumulator 51 generates the carry signal. The AND gate 53 receives and combines the carry signal and the clock signal in order to synchronize the carry signal to the clock signal. The synchronized carry signal is provided as a buffer control signal to the OR gate 14. In addition, the carry signal is provided directly to the first latch 41 and the second latch 42 as the read enable signal.

A new bit stream having the predetermined number of bits is received by the first latch 41 and the second latch 42 without delay after generating the carry signal.

As a result, the VLC decoder in accordance with the present invention eliminates the operation delays occurring in the operation of the components and effectively improves the operation speed While the present invention has been shown and described in connection with the preferred embodiments thereof, it will be readily apparent to those of ordinary skill in the art that many changes and modifications may be made without departing from the spirit and scope of the invention as defined in the appended claims.

What is claimed is:

1. A variable length code decoding apparatus having an interface means for extracting in parallel an objective bit stream having a predetermined number of bits from a $2^n$-bit variable length coded serial input bit stream, n being a positive integer, a control means for generating a buffer control signal, a barrel shifter control signal, a carry signal and a clock signal, and a lookup table memory means, connected to the interface means and the control means, for decoding the objective bit stream from the interface means and outputting a decoded symbol together with its codeword length data, characterized in that said interface means comprises:

a buffer for storing said input bit stream temporarily and, in response to the buffer control signal, extracting in parallel the objective bit stream having the predetermined number of bits;

a buffer status control logic means for initially detecting the number of bits stored in the buffer and outputting only once a first control signal if the number of bits stored in the buffer is higher than the predetermined number;

a connecting logic means for connecting the first control signal and the buffer controlsignal to the buffer;

a first latch means for, in response to the carry signal, receiving in parallel and holding the bit stream provided from the buffer and, in response to the clock signal, extracting in parallel the bit stream;

a second latch means for, in response to the carry signal, receiving in parallel and holding the bit stream from the first latch means and, in response to the clock signal, extracting in parallel the bit stream; and a barrel shifter for, in response to the barrel shifter control signal, receiving in parallel and holding and combining the output bit stream from each of the first and the second latch means and then applying to the lookup table memory means the combined objective bit stream.

2. The variable length code decoding apparatus of claim 1, wherein said control means includes:
   an accumulator for accumulating the codeword length data from the lookup table memory means and generating the carry signal whenever the decoding of the objective bit stream is completed in the lookup table memory means;
   a clock for generating a clock signal;
   a latch means for receiving and holding the accumulated codeword length data and, in respondse to the clock signal, outputting the accumulated codeword length data as the barrel shifter control signal until new codeword length data is fed from the lookup table memory means; and
   a synchronizing logic means for receiving the carry signal and the clock signal and synchronizing the carry signal to the clock signal and outputting the synchronized carry signal as the buffer control signal.

* * * * *